United States Patent [19]

Clark et al.

[11] Patent Number: 5,041,753
[45] Date of Patent: Aug. 20, 1991

[54] HIGH TORQUE MAGNETIC ANGULAR POSITIONING MOTOR

[75] Inventors: Arthur E. Clark, Adelphi; Joseph P. Teter, Silver Spring, both of Md.

[73] Assignee: The United States of America as represented by the Secretary of the Navy, Washington, D.C.

[21] Appl. No.: 607,345

[22] Filed: Oct. 11, 1990

[51] Int. Cl.⁵ .................................................. H01L 41/08
[52] U.S. Cl. ..................................... 310/328; 310/26; 318/118
[58] Field of Search ............... 310/26, 317, 323, 328; 318/118

[56] References Cited

U.S. PATENT DOCUMENTS

| | | | |
|---|---|---|---|
| 4,455,501 | 6/1984 | Tojo et al. | 310/328 |
| 4,578,607 | 3/1986 | Tojo et al. | 310/328 |
| 4,703,464 | 10/1987 | Howarth et al. | 310/26 |
| 4,743,792 | 5/1988 | Ueyama | 310/328 |

FOREIGN PATENT DOCUMENTS 1005585 4/1952 France .................................. 310/26

Primary Examiner—Steven L. Stephan
Assistant Examiner—D. L. Rebsch
Attorney, Agent, or Firm—Kenneth E. Walden; Jacob Shuster

[57] ABSTRACT

Axially elongated drive modules are interconnected at their opposite ends to angularly spaced supports in a polygonal arrangement on an inner ring to establish tensile stress therein, while intermediate module centers are spaced from an inner shaft by solenoid locks. Each module includes at least two magnetostrictive rod elements held in axial alignment at their adjacent ends by a coupling, through which the module is radially spaced from the common axis. Drive coils electrically energized to generate magnetic fields cause simultaneous elongation and contraction of the rod elements to apply unidirectional torque to a rotor formed by either the outer ring or the inner shaft.

18 Claims, 3 Drawing Sheets

HIGH TORQUE MAGNETIC ANGULAR POSITIONING MOTOR

BACKGROUND OF THE INVENTION

This invention relates generally to the conversion of electrical power into mechanical power in the form of high-torque rotary motion, and more particularly in the use of magnetostriction to accomplish such purpose.

Magnetostriction motors are generally well known in the art and involve the use of an active magnetostrictive body such as an elongated rod which undergoes dimensional change when magnetized by a field generated by electrical energization of a surrounding drive coil, as disclosed for example in U.S. Pat. No. 2,105,479 to Hayes. The use of a plurality of such magnetostrictive rods interconnected in various arrangements are also known in the art, as disclosed for example in U.S. Pat. Nos. 3,439,199 and 3,634,742 to Bergstrand et al and Edson, respectively.

The foregoing magnetostrictive motors transform electrical power directly into mechanical linear motion. Various gearing arrangements or the like would therefore be required in order to convert such linear motion into rotary motion or angular displacement. In conventional electrodynamic motors, a rotary motion output at high torque is obtained by use of unwieldly and costly reduction gear boxes with an accompanying decrease in rotational speed. Such gear boxes are usually associated with undesirable backlash and friction, creating problems in achieving angular positioning accuracy and performance maintenance.

It is therefore an important object of the present invention to magnetostrictively transform electrical power into rotary motion at a high torque without any gear boxes and the aforementioned problems associated therewith.

Another object of the invention in accordance with the foregoing object is to more directly and efficiently convert electrical power into rotary motion at high torque levels by utilization of magnetostrictive materials.

SUMMARY OF THE INVENTION

In accordance with the present invention, a plurality of magnetostrictive modules are respectively connected in radially spaced relation to an anchor member to define a common rotational axis. The modules are connected at opposite longitudinal ends thereof at angular spaced location on an annular ring to form a polygonal arrangement of the modules of a rotary unit. Each module includes at least two magnetostrictive rod elements held in axial alignment with each other at adjacent ends by a coupling through which the rod elements are anchored relative to the anchor member aforementioned. Field generating drive coils are mounted on each of the two rod elements of each module and are electrically energized during drive cycles to simultaneously cause axial elongation of one rod element and axial contraction of the other rod element in each module. Such simultaneous and opposite magnetostrictive deformation of the rod elements when anchored at their adjacent ends transmits forces in one linear direction through its module which is fastened in chordal relation directly to the annular ring aforementioned in order to establish a compressive stress in the module. A high rotational torque is thereby produced during each drive cycle as a function of the ratio of the axial length of the rod elements in each module and its radial spacing from the common rotational axis. Either the anchor member or the annular ring may act as the rotor while the other is held stationary as a reaction frame.

High torque is obtained by means of the foregoing arrangement as a result of high atomic forces of magnetostriction in the rod elements of each drive module. It is accordingly desirable to use materials with large magnetostriction exceeding 1000 ppm, for example, such as the rare earth-iron compound Terfenol-D referred to in our copending application, Ser. No. 07/607,350, filed Oct. 11, 1990.

BRIEF DESCRIPTION OF DRAWING FIGURE

Other objects, advantages and novel features of the invention will become apparent from the following detailed description of the invention when considered in conjunction with the accompanying drawing wherein.

DETAILED DESCRIPTION OF PREFERRED EMBODIMENT

Figures 1, 2:
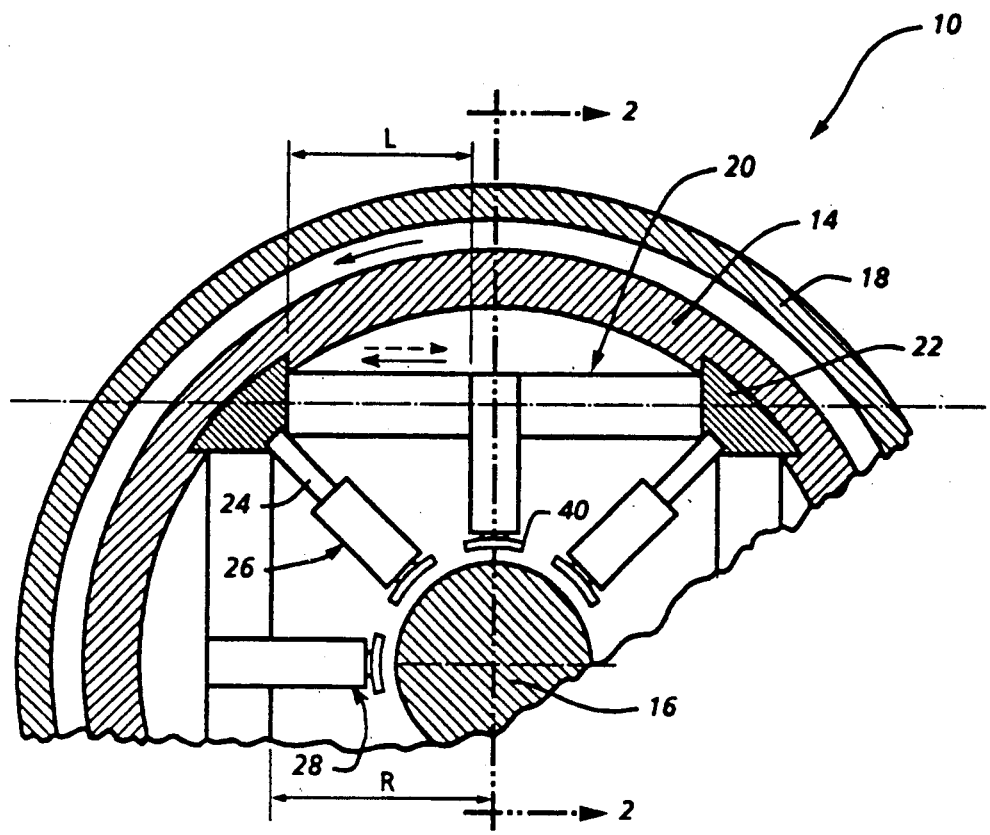
FIG. 1 is a transverse section view of a rotary unit of a magnetostrictive motor constructed in accordance with one embodiment of the invention.
FIG. 2 is a side section view taken substantially through a plane indicated by section line 2—2 in FIG. 1.
Figure 3:
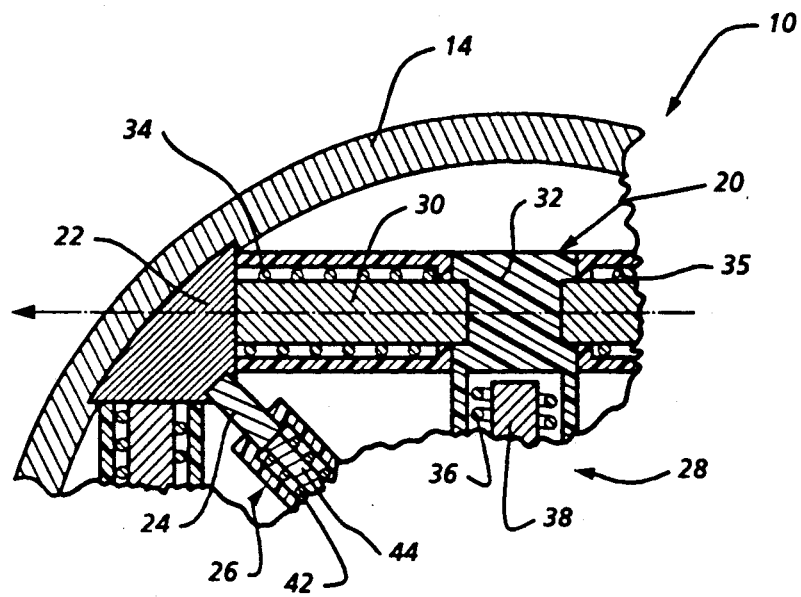
FIG. 3 is an enlarged partial section view taken substantially through a plane indicated by section line 3—3 in FIG. 2.

Referring now to the drawing in detail, FIGS. 1-3 illustrate a rotary unit of a magnetostriction motor generally referred to by reference numeral 10 constructed in accordance with one embodiment of the invention. In this embodiment of the invention, a mechanical power output shaft 12 as shown in FIG. 2 extends from an annular ring type rotor 14 of circular crosssection. The annular ring 14 is journalled on a stationary shaft 16 acting as a reaction anchor frame in axial alignment with rotor shaft 12. A rotor-enclosing housing 18 may be connected to anchor shaft 16 as shown. Mounted within the rotor ring 14 about the anchor shaft 16 are a plurality of magnetostrictive drive modules of the expand contract type, respectively referred to by reference numeral 20, arranged in chordal relation to the rotor ring 14 internally thereof to form an equilateral polygon therein as shown in FIG. 1. The modules 20 are rigidly fastened to each other at opposite longitudinal ends thereof and to angularly spaced portions of the annular rotor for module loading purposes by suitable connectors 22. As more clearly seen in FIG. 1, four of such modules 20 are utilized in the illustrated embodiment, by way of example, to form a square in chordal relation to the rotor about its rotational axis which is coincident with the geometrical axis of the anchor shaft 16.

As also shown in FIG. 1, compression rods 24 extend inwardly from each of the module loading connectors 22 in radial relation toward the anchor reaction shaft 16. Electrically operated lock devices 26 are associated with the compression rods 24 while electrically operated lock devices 28 are associated with the modules 20 to selectively control alternate connection of compression rods and modules to the anchor shaft as will be explained in detail hereinafter.

Referring now to FIG. 3 in particular, each of the modules 20 includes at least one pair of axially aligned magnetostrictively active elements 30 having adjacent ends interconnected by a coupling 32 from which one of the lock devices 28 extends radially inwardly toward the anchor shaft 16. The opposite remote ends of the magnetostrictive elements 30 are fastened to the rotor ring 14 by two of the loading connectors 22. Magnetic field applying coils 34 and 35 are respectively mounted about the two elements 30 of each module as shown to generate properly phased magnetic fields with respect to the common longitudinal axis of the elements 30 in each module.

Each of the modules 20 is selectively connected to the anchor shaft 16 through its coupling 32 by energization of electromagnetic coil 36 in its lock device 28 to project a solenoid plunger 38 with a friction pad 40 thereon into engagement with the anchor shaft 16, as more clearly seen in FIG. 2, in order to enable application of torque to the rotor. Similarly, each rotor lock device 26 is energized through its electromagnetic coil 42 as shown in FIG. 3 to project its solenoid plunger 44 with a friction pad thereon into engagement with the anchor shaft 16 as shown in FIG. 1, in order to fixedly anchor the rotor in its static condition through the compression rods 24. Other lock engaging devices could of course be utiized to perform the same function.

Figure 4:
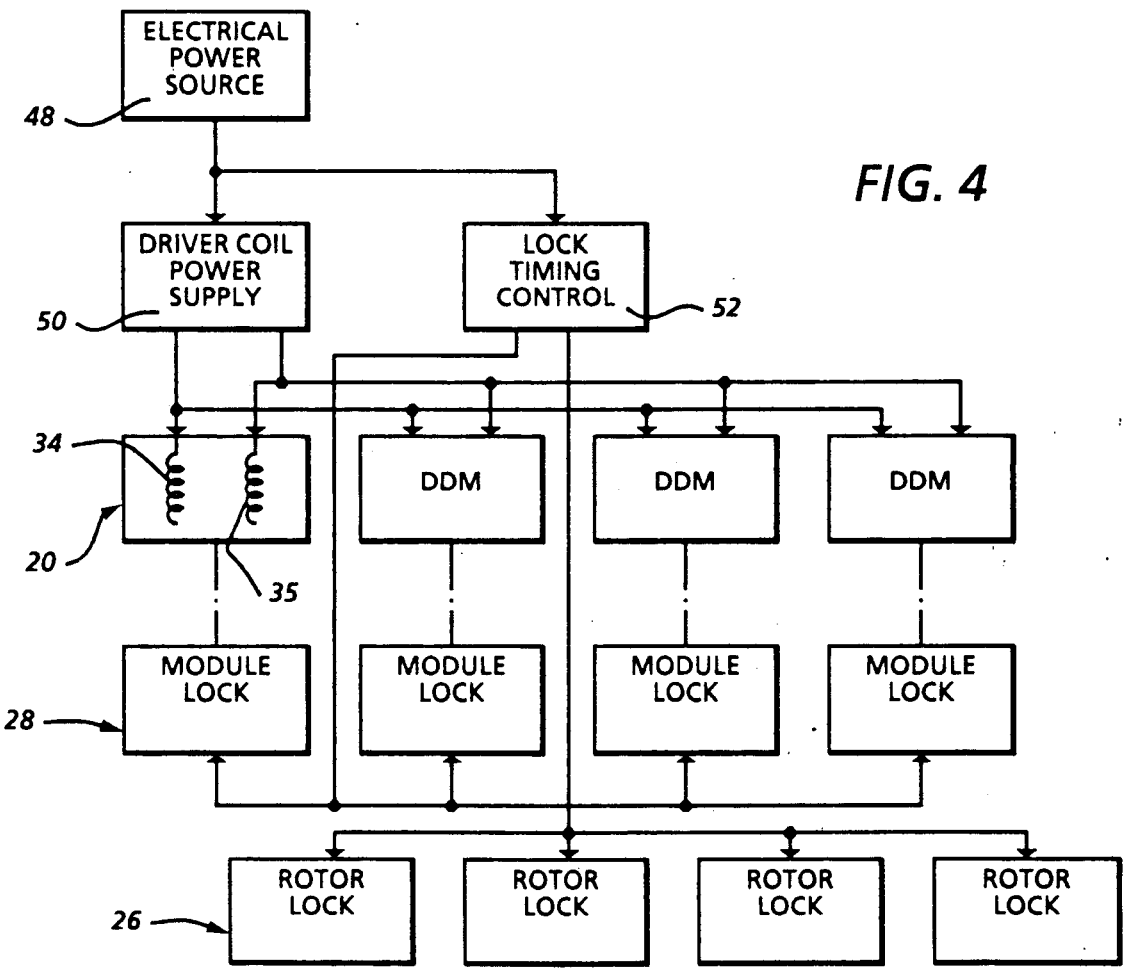
FIG. 4 is a simplified block diagram of the electrical power system associated with the rotary unit of the motor depicted in FIGS. 1-3.

As diagrammed in FIG. 4, a suitable source of electrical power 48 is connected to a coil driver power supply 50 through which the aforementioned magnetic fields are simultaneously established in each of the modules 20. Accordingly, one of the two force transmitting subassemblies respectively formed by the elements 30 and their drive coils in each of the modules is magnetostrictively deformed to cause longitudinal elongation or expansion thereof while, at the same time, the element 30 of the other force transmitting subassembly is magnetostrictively contracted in the same longitudinal direction. Such simultaneous and opposite deformations of the two subassemblies in each module 20 with adjacent ends thereof anchored to the shaft 16 exert simultaneous axial forces in the same direction from the remote ends thereof to the rotor ring 14 at the angularly spaced chordal locations of the connectors 22. Accordingly, an increased rotational torque is applied by each module to the rotor by virtue of the opposite nature of the simultaneous deformations of such modules relative to end adjacent end portions of the force transmitting subassemblies, respectively formed by the active elements 30 and the coils 34 and 35. The rotor will thus undergo unidirectional angular displacement by a limited amount ($\theta$) during an operational cycle while the modules 20 are anchored to shaft 16 by energization of their lock devices 28. At the end of such drive cycle, the rotor is locked to anchor shaft 16 by the rotor lock devices 26 to enable application of longitudinal compressive stress to the modules through the compression rods 24 as the modules are released from the anchor shaft 16 by deenergization of the lock devices 28. The elements 30 therefore return to their static condition under the longitudinal compressive stress before the next drive cycle is repeated with release of the rotor by deenergization of the lock devices 26. The power source 48 as diagrammed in FIG. 4 is accordingly connected to a timing control 50 through which the module lock devices 28 and rotor lock devices 26 are alternatively energized in proper timed relation to each other to enable optimum intermittent application of unidirectional torque to the rotor by energization of the module coils 34 and 35 under control of the coil driver supply 50.

Figure 5:
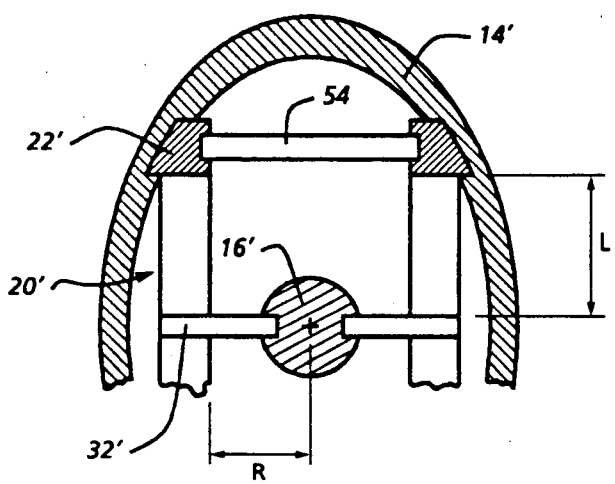
FIG. 5 is a partial transverse section view of a magnetostrictive rotary motor unit in accordance with another embodiment of the invention.

In the embodiment described with respect to FIGS. 1–4, the compression rods 24 are mechanically stiffer than the active elements 30 of the modules in order to establish the necessary longitudinal compressive stress therein between drive cycles. Such compression rods may be eliminated together with their lock devices 26 by selection of a material for the rotor which is stiffer than the active elements of the magnetostrictive modules so as to be relatively nondeformable between the locations of connectors 22 and act as an outer compression ring for the modules. FIG. 5 shows such an embodiment wherein a rotary unit includes magnetostrictive modules 20' with their remote longitudinal ends connected to an oval shaped rotor 14' by connectors 22'. Bracing rods 54 extend between connectors 22' in chordal relation to the rotor 14' which acts an outer compression element for the modules. The modules 20' are furthermore permanently anchored by their intermediate couplings 32' to a common anchor shaft 16'.

Figure 6:
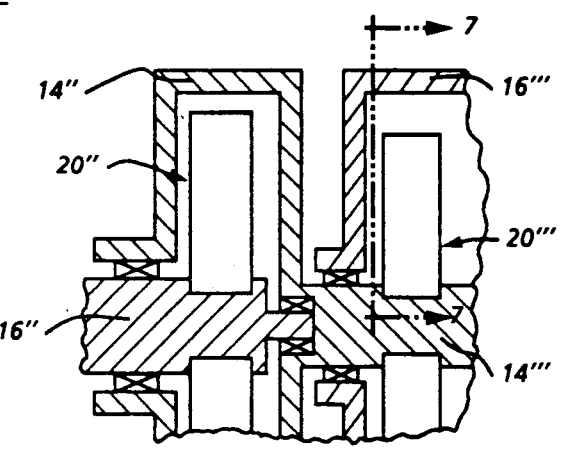
FIG. 6 is a partial side section view of a plurality of rotary motor units in accordance with yet another embodiment of the invention.
Figure 7:
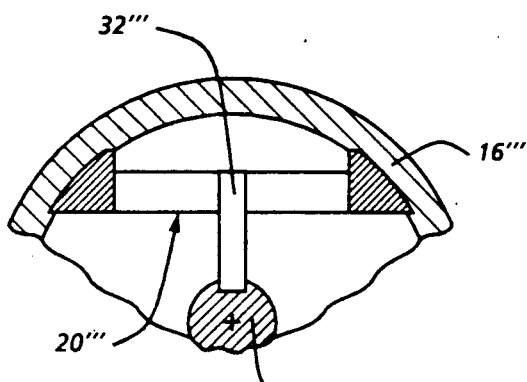
FIG. 7 is a partial section view taken substantially through a plane indicated by section line 7—7 in FIG. 6.

In each of the foregoing embodiments of the invention, wherein the rotor forms a radially outer ring rotated relative to an inner reaction anchor shaft, the angular displacement ($\theta$) of the rotor when the module coils are energized is given by the formula $\theta = \lambda L/R$, where ($\lambda$) is the magnetostriction of the material of the active elements 30 as a function of the magnetic fields or field generating current. The dimensions (L) and (R) respectively represent the length of the module elements 30 and the radial spacing of the modules from their common rotational axis as denoted in FIGS. 1 and 5. It will be apparent from the foregoing formula that the angular displacement ($\theta$) may be increased by increasing the ratio L/R as a design option by selection of an oval shaped rotor as shown in FIG. 5 rather than a circular shaped rotor shown in FIG. 1. Angular displacement may also be increased by different stacking arrangements of individual rotary units as illustrated in FIGS. 6 and 7, by way of example. The individual rotary units shown in FIG. 6 have their outer rings and inner anchoring shafts functionally interchanged by interconnecting the outer annular ring 14'' of one unit with rotatable rotor shaft 14''' of the next unit, with which an annular ring 16''' is associated acting as a frame reaction member.

Figure 8:
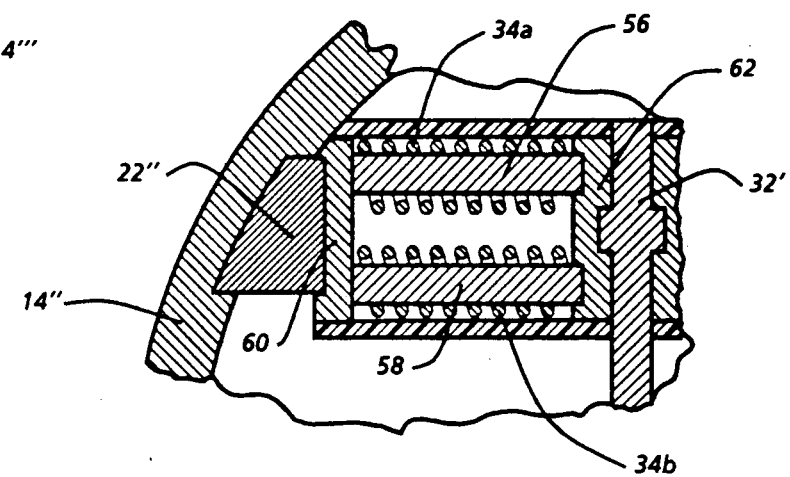
FIG. 8 is an enlarged partial transverse section view showing another embodiment of the drive modules in the motor depicted in FIG. 3.

FIG. 8 illustrates a modified form of module wherein each force transmitting element 30 and associated coil 34 or 35 is replaced by a magnetostrictive subassembly formed by two parallel active elements 56 and 58 interconnected at opposite ends by flux conducting connectors 60 and 62. The elements 56 and 58 are respectively surrounded by field generating coils 34$a$ and 34$b$ of the same polarity. Two of such subassemblies which are identical are interconnected at adjacent ends in longitudinal alignment and anchored threat by coupling 32''.

The remote ends of the subassemblies are fastened to the rotor 14" by connectors 22".

Numerous other modifications and variations of the present invention are possible in light of the foregoing teachings. It is therefore to be understood that within the scope of the appended claims the invention may be practiced otherwise than as specifically described.

What is claimed is:

1. In a device for converting electrical energy into mechanical energy, including at least two active elements deformed by magnetic fields applied thereto and coupling means interconnecting said elements for unidirectional transmission of forces in response to simultaneous and opposite deformation of the elements by said application of the magnetic fields, an annular member, loading means connecting the annular member to the elements for maintaining the elements under compressive stress opposing said unidirectional transmission of forces, an anchoring member and reaction means connecting the elements through the coupling means to the anchoring member independently of the annular member for imparting angular motion to one of said members in response to said unidirectional transmission of forces.

2. The combination of claim 1 including motion control means operatively connected to the anchoring member for limiting said angular motion imparted to one of said members.

3. The combination of claim 1 wherein said active elements respectively have adjacent longitudinal ends interconnected by the coupling means in longitudinal alignment and opposite ends remote from the coupling means connected by the loading means to the annular member at separate locations thereon.

4. The combination of claim 3 wherein said annular member is made of a material having greater stiffness than the elements to maintain said elements under the compressive stress.

5. The combination of claim 3 wherein said loading means comprises rods stiffer than the elements interconnected between the anchor member and the annular member adjacent to the opposite remote ends of the elements.

6. The combination of claim 5 including motion control means operatively connected to the anchoring member for limiting said angular motion imparted to one of the members.

7. The combination of claim 6 wherein said motion control means includes releasable lock means selectively connecting the coupling means and the rods to the anchoring member and timing means operatively connected to the releasable lock means for alternately effecting said selective connections of the coupling means and the rods to the anchoring member.

8. The combination of claim 7 wherein said anchoring member is a stationary shaft having angularly spaced portions engageable by the releasable lock means.

9. The combination of claim 1 wherein said active elements respectively have adjacent longitudinal ends interconnected by the coupling means in longitudinal alignment.

10. In a device for converting electrical energy into mechanical energy, including at least two active elements magnetostrictively deformed by magnetic fields applied thereto and coupling means interconnecting said elements for unidirectional transmission of forces in response to said application of the magnetic fields, an annular member, loading means directly connecting the annular member to the elements for maintaining the elements under compressive stress, an anchoring member and reaction means connecting the elements through the coupling means to the anchoring member for imparting angular motion to one of said members in response to said unidirectional transmission of forces, said active elements respectively having adjacent longitudinal ends interconnected by the coupling means in longitudinal alignment, said loading means including connector means for fastening the respective opposite ends of the elements remote from the coupling means to the annular member in fixed angular spaced relation and compression rods interconnecting said connector means with the anchoring member.

11. The combination of claim 10 further including releasable lock means selectively connecting the coupling means and the connecting rods to the anchoring member and timing means operatively connected to the releasable lock means for alternately effecting said selective connections of the coupling means and the connecting means to the anchoring member.

12. The combination of claim 11 wherein said anchoring member is a stationary shaft having angularly spaced portions engageable by the releasable lock means.

13. In a device for converting electrical energy into mechanical energy, including at least two active elements magnetostrictively deformed by magnetic fields applied thereto and coupling means interconnecting said elements for unidirectional transmission of forces in response to said application of the magnetic fields, an annular member, loading means directly connecting the annular member to the elements for maintaining the elements under compressive stress, an anchoring member and reaction means connecting the elements through the coupling means to the anchoring member for imparting angular motion to one of said members in response to said unidirectional transmission of forces, said active elements respectively having opposite ends and adjacent longitudinal ends interconnected by the coupling means in longitudinal alignment and said compressive stress establishing loading means including connector means for fastening the respective opposite ends of the elements remote from the coupling means to the annular member in fixed angular spaced relation and compression rods interconnecting said connector means with the anchoring member.

14. In a device for converting electrical energy into mechanical energy, including a rotor, an anchoring member, a plurality of drive modules, loading means operatively connected to the rotor and the anchoring member for establishing compressive stress in the modules between separate locations on the rotor, coupling means interconnecting each of the modules to the anchoring member independently of the rotor for transferring torque to the rotor in response to deformations of the modules and power supply means connected to each of the modules for inducing said deformations to control the torque transferred to the rotor.

15. The combination of claim 14 wherein each of said modules includes at least two magnetostrictive elements and field generating coils associated therewith to which the power supply means is connected, said elements having opposite remote ends fastened by the loading means to the rotor at said separate locations in relative fixed spaced relation.

16. In a device for converting electrical energy into mechanical energy, including a rotor, at least one drive module, a power source, field generating means connected to said source for inducing deformations of opposite character within the module between fixedly spaced locations on the rotor, loading means connected to the module at said fixedly spaced locations on the rotor for establishing compressive stress in the module and reaction means connected to the module independently of the rotor for enabling unidirectional transmission of driving torque to the rotor in response to said deformations.

17. The combination of claim 16 wherein said module includes at least one pair of force transmitting subassemblies and coupling means for interconnecting said subassemblies, said deformations of opposite character being simultaneous elongation and contraction of the respective subassemblies between the reaction means and the loading means to induce angular motion of the rotor.

18. The combination of claim 17 wherein each of said force transmitting subassemblies includes at least two active elements and flux conducting connectors interconnecting said elements in parallel between the reaction means and angularly spaced locations on the rotor.

* * * * *